US006397172B1

United States Patent
Gurney

(10) Patent No.: US 6,397,172 B1
(45) Date of Patent: May 28, 2002

(54) ADAPTIVE INTEGRATED CIRCUIT DESIGN SIMULATION TRANSISTOR MODELING AND EVALUATION

(76) Inventor: David J. Gurney, 20540 Suncrest Dr., West Linn, OR (US) 97068

( * ) Notice: Subject to any disclaimer, the term of this patent is extended or adjusted under 35 U.S.C. 154(b) by 0 days.

(21) Appl. No.: 09/333,122

(22) Filed: Jun. 14, 1999

(51) Int. Cl.⁷ .............................................. G06F 17/50
(52) U.S. Cl. ............................. 703/14; 703/22; 716/6
(58) Field of Search ............................ 703/13, 14, 15, 703/16, 17, 19, 22; 716/6

(56) References Cited

U.S. PATENT DOCUMENTS 5,553,008 A    9/1996  Huang et al. .................. 703/14

OTHER PUBLICATIONS

Dhar et al, "Current and Charge Estimation in CMOS Circuits", Proceedings of the Conference on Asia Pacific Design Automation Conference (CD–ROM), pp. 13–18 (Sep. 1995).*
Stein et al, "ADAPTS: A Digital Transient Simulation Strategy for Integrated Circuits", Proceedings of the 28th ACM/IEEE Design Automation Conference, pp. 26–31 (Jun. 1991).*
Kao et al, "Timing Analysis for Piecewise Linear Rsim", IEEE Transactions on Computer–Aided Design of Integrated Circuits, vol. 13 Issue 12, pp. 1498–1512 (Dec. 1994).*
Devgan, A., "Transient Simulation of Integrated Circuits in the Charge–Voltage Plane," IEEE Transactions on Computer–Aided Design of Integrated Circuits and Systems, Nov. 1996, IEEE, USA, vol. 15, No. 11, pp. 1379–1390.
Devgan, A., et al., "Adaptively Controlled Explicit Simulation," IEEE Transactions on Computer Aided Design on Integrated Circuits and systems, Jun. 1994, vol. 13, No. 6, IEEE Inc., New York, US pgs. 746–762.

* cited by examiner

Primary Examiner—Kevin J. Teska
Assistant Examiner—Samuel Broda
(74) Attorney, Agent, or Firm—Columbia IP Law Group, PC

(57) ABSTRACT

An IC design computer simulation tool is provided with a design reader equipped to assign device characterizations to electronic devices of an IC design, and model evaluators equipped to adaptively perform model evaluations in accordance with the electronic devices' assigned device characterizations. In one embodiment, the electronic devices include transistors, and the adaptive model evaluations provide evaluated model quantities to support solution of the circuit node voltages using fully coupled (implicit) or partially decoupled (explicit) solution techniques. In particular, the transistor capacitive coupling currents are expressed according to the assigned device characterizations.

36 Claims, 6 Drawing Sheets

DEVICE CHARACTERIZATION 302

| TYPES 304 | CRITERIA | ADAPTIVE EVALUATION |
|---|---|---|
| I | COUPLED TO CAPACITANCE OR BULK IS VARYING | IMPLICIT* |
| II | CAPACITOR ONLY | IMPLICIT* |
| III A | FORWARD EFFECT | EXPLICIT* |
| III B | REVERSE EFFECT | EXPLICIT* |

*SEE SPECIFICATION FOR DETAILS

ADAPTIVE INTEGRATED CIRCUIT DESIGN SIMULATION TRANSISTOR MODELING AND EVALUATION

BACKGROUND OF THE INVENTION

1. Field of the Invention

The present invention relates to the field of simulating integrated circuit (IC) designs. More specifically, the present invention relates to model evaluations performed during simulation.

2. Background Information

Circuit simulation involves taking a description of a circuit usually called a netlist, and a description of the input stimulus and then solving certain mathematical equations to determine the response of the circuit to the given input stimulus over the simulation time period. An example of a circuit simulator is the SPICE simulator, originally developed by W. Nagel. See e.g. W. Nagel, "SPICE2, A computer program to simulate semiconductor circuits", University of California, Berkeley, Memo No. ERL-M520, May 1975. Circuit simulators like SPICE represent a circuit as a set of coupled first order non-linear differential equations. Well-known techniques like Modified Nodal Analysis are used to perform this mathematical representation. The set of coupled non-linear equations is then solved using a sequence of steps, as illustrated in FIG. 7. The steps involve determining the time-step of integration, linearising the differential equations, and solving the resulting set of linear algebraic equations. The process is repeated till convergence is reached. Once convergence has been achieved, time is advanced and the entire process is repeated.

This traditional method of circuit simulation has a time complexity of $O(N^3)$ in the worst case and $O(N^{1.5})$ in the average case. This is due to the step involving the solution of the linear algebraic equations. This solution requires solving a matrix which has the time complexity of $O(N^3)$. Due to this super-linear time complexity of the algorithm in circuit simulators like SPICE, they are incapable of solving large circuits. Usually the limits of such simulators are reached when circuit sizes reach 100,000 devices. Solving circuits larger than this size becomes impossible since the time taken to find the solution becomes very large.

The need to solve large circuits is becoming ever more important due to the advances of silicon process technology. Integrated circuits or chips with multimillion transistors are quite common. In order to address this need, alternative algorithms have been developed. For example, algorithms developed by C. X Huang etc, as disclosed in C. X. Huang et al., "The design and implementation of Powermill", Proceedings of the International Symposium on Low Power Design, pp. 105–120, 1995, by Y.-H. Shih etc as disclosed in Y. H. Shin et al., "ILLIADS: A new Fast MOS Timing Simulator Using Direct Equation Solving Approach" Proceedings of 28th ACM/IEEE Design Automation Conference, 1991, and by A. Devgan as disclosed in A. Devgan, "Transient Simulation of Integrated Circuits in the Charge-Voltage Plane", IEEE Transactions on Computer-Aided Design of Integrated Circuits and Systems, VI. 15, No. 11, November 1996. These algorithms are characterized by a linear O(N) time complexity, thereby allowing them to handle large circuits.

The linear time complexity in these algorithms is achieved by partitioning the circuit into small partitions. To avoid the super-linear time of matrix solution, these algorithms use an approximate (i.e. inaccurate) solution instead. Under Huang's approach, an algorithm called one-step relaxation is used. This algorithm often has inaccuracies of up to 20% and has serious problems on stiff circuits. In common circuits, relaxation based algorithms do not obtain the correct results. Circuits characterized by tight feedback or coupling cause problems for these algorithms. Under Shih's approach, a direct equation solving technique is used; this works well in very limited situations where the device models can be accurately modeled by the second-order Shichman and Hodges model. This is rarely true with the latest silicon process technologies that require the very complex and highly non-linear BSIM3 models for accurate device models. Devgan uses an explicit integration technique but as evidenced from the waveforms in this paper, the accuracy is inadequate. The common problem with using any approximate algorithm for solving the matrix equations is that accuracy is usually not consistently good for all circuit design styles, especially for stiff circuits.

Standard matrix based algorithms do not suffer from the inaccuracy of relaxation and other approximate algorithms. Using matrix based algorithms along with partitioning can result in good accuracy; only the nodes at the boundaries of partitions can have degraded accuracy. However, use of single time-step for all partitions produces significantly reduced performance. Furthermore, in evaluating transistor models, numerous capacitance and derivative voltage values are required in solving the equations.

Thus, an improved approach to circuit simulation is desired.

SUMMARY OF THE INVENTION

An IC design computer simulation tool is provided with a design reader equipped to assign device characterizations to electronic devices of an IC design, and model evaluators equipped to adaptively perform model evaluations in accordance with the electronic devices' assigned device characterizations. In one embodiment, the electronic devices include transistors, and the adaptive model evaluations provide evaluated model quantities to support solution of the circuit node voltages using fully coupled (implicit) or partially coupled (explicit) solution techniques. In particular, the transistor capacitive coupling currents are expressed according to the assigned device characterizations.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as transistors, current, voltage, capacitance, charges, and so forth. Also, parts of the description will also be presented in terms of operations performed by a computer system, using terms such as assigning, deriving, computing, and the like. As well understood by those skilled in the art, these quantities take the form of electrical, magnetic, or optical signals capable of being stored, transferred, combined, and otherwise manipulated through electrical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 1:
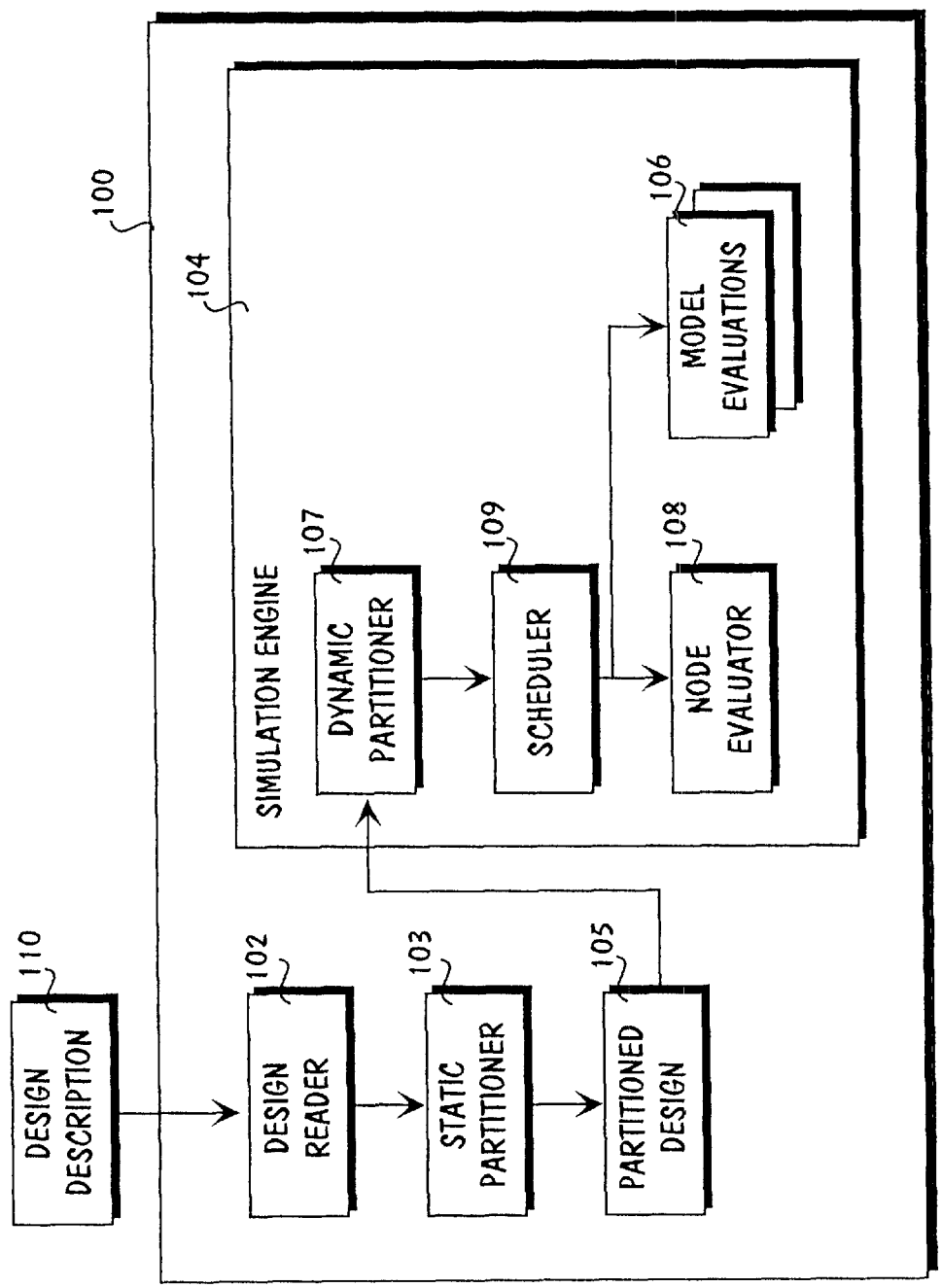
FIG. 1 illustrates an overview of the present invention in accordance with one embodiment.

Referring now FIG. 1, wherein a block diagram illustrating an overview of the present invention in accordance with one embodiment is shown. As illustrated, the IC design simulation tool 100 of the present invention is constituted with design reader 102, static partitioner 103 and simulation engine 104 comprising dynamic partitioner 107, scheduler 109, node evaluator 108 and model evaluators 106. The elements are operatively coupled to each other as shown. As will be described in more detail below, design reader 102 and some model evaluators 106, in particular a transistor model evaluator, are incorporated with the teachings of the present invention. Certain aspects of static partitioner 103, dynamic partitioner 107 and scheduler 109 are the subject of co-pending U.S. patent application Ser. No. 09/333,124, contemporaneously filed and entitled "Circuit Simulation Using Dynamic Partition and On-Demand Evaluation", which is hereby fully incorporated by reference.

As in the prior art, design reader 102 is used to read design description 110 provided by a designer. Design description 110 includes connectivity information connecting various models modeling electronic devices in the IC design. In one embodiment, in addition to flattening a hierarchical design, design reader 102, in accordance with the present invention also assigns device characterizations to selected ones of the electronic devices of the IC design. Static partitioner 103 pre-compiles or pre-partitions the IC design into static partitions as well as pre-processes the static partitions into a form particularly suitable for the dynamic partitioner 107.

During simulation, dynamic partitioner 107 further forms and reforms dynamic partitions of the IC design that are relevant, referencing the preformed static partitions. Scheduler 109 determines whether evaluations are necessary for the dynamic partitions for the particular simulation time step, and schedules the dynamic partitions for evaluation on an as-needed or on-demand basis. Accordingly, node evaluator 108 and model evaluators 106 are selectively invoked on an as needed or on-demand basis to evaluate the states of the connections connecting the models, and various parameter values of the models, such as current, voltage and so forth, respectively. In one embodiment, at least one of the model evaluators adaptively performs the model evaluations at different accuracy or performance levels in accordance with the assigned device characterizations of the devices. Where accuracy is needed, the evaluations are performed through matrix solution.

Formation of static partitions, and formation of dynamic partitions, as well as scheduling evaluations on demand, i.e. on an as needed basis, are explained in the above identified, incorporated by reference, co-pending U.S. patent application. Device characterization and employment of such device characterizations to adaptively perform model evaluation (when evaluation is needed) will be describe in more detail below in turn. As those skilled in the art will appreciate from the description to follow, the present invention advantageously allows accuracy to be achieved where needed, but otherwise, performance to be achieved where the highest levels of accuracy are unnecessary. As a result, the present invention achieves an overall level of performance and accuracy that is superior to that of the prior art approaches.

Figures 2, 3:
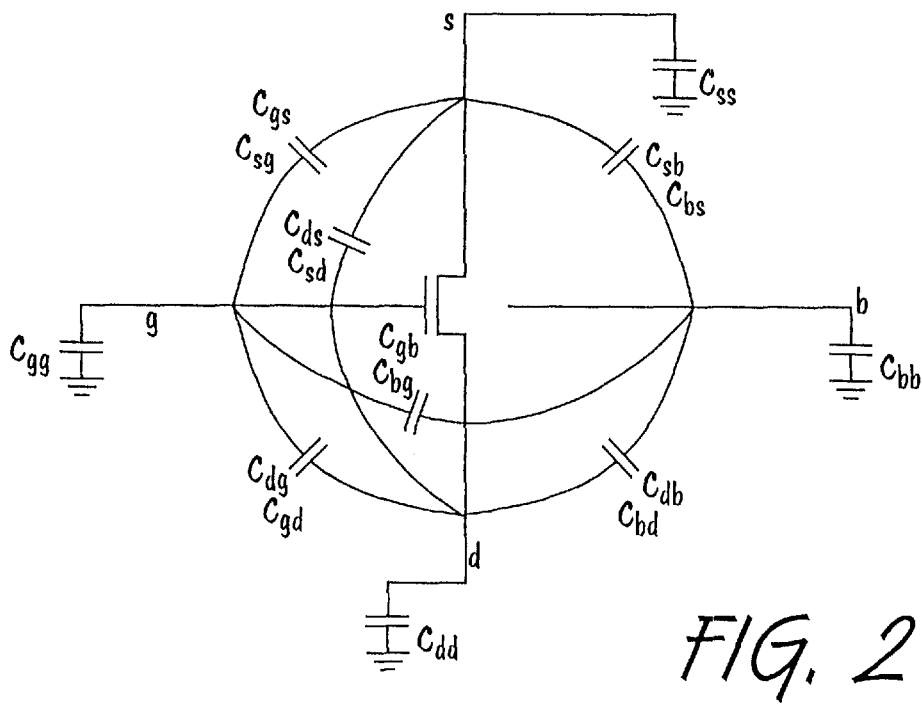
FIG. 2 illustrates a four terminal capacitance model in accordance with one embodiment.
FIG. 3 illustrates device characterization in accordance with one embodiment.

In one embodiment, the electronic devices in IC design that receive device characterization assignment include, in particular, transistors. In accordance with this embodiment, the capacitances of the transistors are modeled employing a four terminal charge model as illustrated in FIG. 2, to be described more fully below. Furthermore, as illustrated in FIG. 3, at least three device characterizations 302 corresponding to three different accuracy/performance approaches 304 to evaluating parameter values of the charge model, are employed to characterize transistors of the IC design.

For the best accuracy, the node voltages of the circuit must be solved simultaneously, by solving a set of fully coupled first-order differential equations. Hence the transistor model needs to express the relationship between the node voltages and their first derivatives. The type I and II characterizations express the voltage relationships in terms of the coupling capacitances of the transistor. The derivation of the capacitances from the charge model is described more fully below.

Since simultaneous solution of a large set of equations is computationally expensive, it is beneficial to performance to be able to decouple these equations. The approach to effectuate the "decoupling" is called "dynamic partitioning" as is discussed in the above identified, incorporated by reference, application. When a particular dynamic partition is being solved for a new time point (i.e. the node voltages of that dynamic partition are being solved) it is possible that a particular device spans that dynamic partition and another. In other words some pins of the device are connected to nodes which belong to the dynamic partition being solved and some pins of the device are connected to nodes belonging to other dynamic partitions. Since the simultaneous solution of node voltages is only performed for nodes within the same dynamic partition, the other, external, nodes must be handled explicitly. One method for explicit representation of node voltages is to use previously computed voltages to derive an estimate of the node voltage for the desired time point. Since the equations for the node voltages within the dynamic partition being solved are still coupled, but the external node voltages are explicitly estimated, we refer to the equations as being partially decoupled.

When the equations are decoupled, the type III characterization is employed. Furthermore, the type IIII has two dynamic modes: forward (IIIA) and reverse (IIIB). In the forward mode, the voltage of the transistor gate and its first derivative are estimated. Then the equation for the voltage on the transistor drain includes an explicit current term due to the capacitive coupling from the gate to the drain, and similarly for the coupling from the gate to the transistor source.

Figure 4:
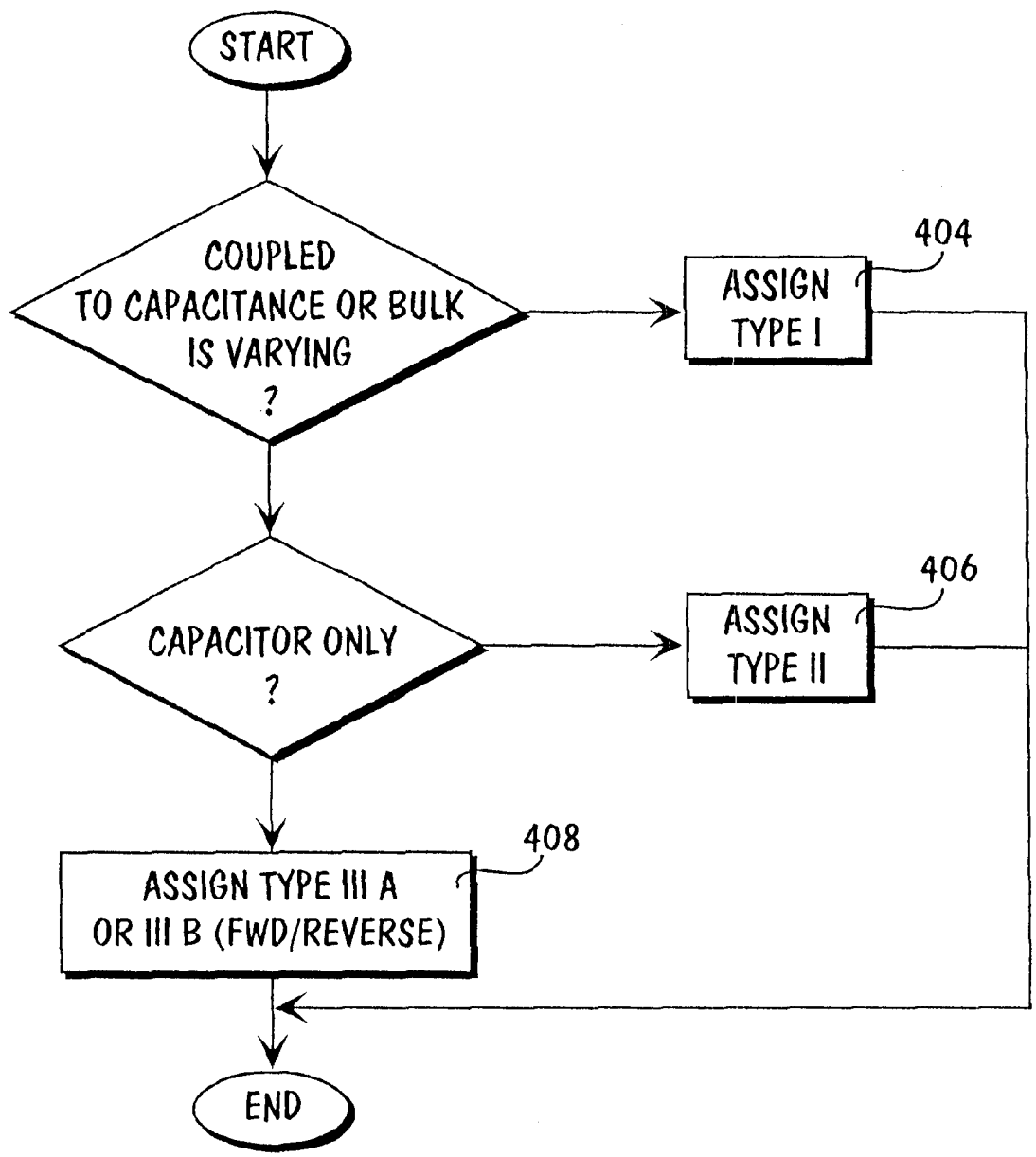
FIG. 4 illustrates an operational flow of design reader of FIG. 1 in accordance with one embodiment.

For the illustrated embodiment, the device characterizations are automatically assigned by design reader 102, however, the designer may override the automatic assignment. The override is facilitated through a command line interface (not shown) of simulation tool 100. As illustrated in FIG. 4, design reader 102 assigns a type I characterization to a transistor (block 404) if it is connected to a coupling capacitor, or if it's bulk is varying. Design reader 102 assigns a type II characterization to a transistor (block 406) if it is effectively being used as a capacitor (e.g. with source and drain shorted). Design reader 102 assigns a type III characterization to the remaining transistors (block 408). In alternate embodiments, other characterization criteria as well as other characterizations may also be employed in additional to or in lieu of all or some of the criteria and characterizations described earlier.

Figure 5:
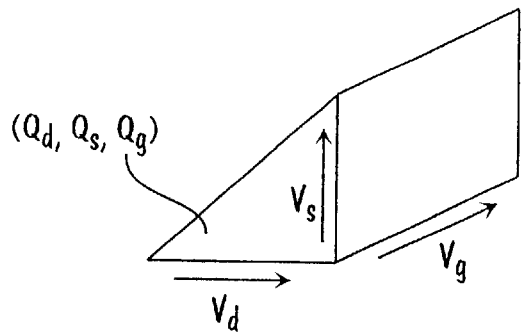
FIG. 5 illustrates a charge table in accordance with one embodiment.

Referring now back to FIG. 2, under the four terminal charge model, the amount of charge (Q) on each terminal is a function of the geometry of the transistor (e.g. length and width) and the terminal voltages ($v_d$, $v_g$, $v_s$, $v_b$), where d, g, s and b stand for drain, gate, source and bulk respectively. The model treats each pin to pin capacitor as an asymmetric device. Each pin is also considered to have an effective capacitance (C) to ground. Each capacitor $C_{xy}$ is defined as the partial derivative $dQ_x/dV_{xy}$, i.e. the change in charge on pin x due to a change in the voltage $V_{xy}$, where xy stand for the effect of y on x, and individually, x and y are either g, d, s or b, standing for gate, drain, source and bulk respectively. The partial derivative $dQ_x/dV_{xy}$ may also be expressed as $-dQ_x/dV_y$. Capacitor $C_{xx}$ is defined as $dQ_x/dV_x$. Additionally, $C_{gg}=dQ_g/dV_g=-dQ_d/dV_g-dQ_s/dV_g-dQ_b/dV_g=C_{dg}+C_{sg}+C_{bg}$. $C_{gg}$ also $=dQ_g/dV_g=-dQ_g/dV_d-dQ_g/dV_s-dQ_g/dV_b=C_{gd}+C_{gs}+C_{gb}$. Thus, of the sixteen capacitance values, only 9 independent values are needed; the remaining 7 dependent values may be derived from the 9 independent values. The 9 independent values may be any 9 of the 16 capacitance values. For the illustrated embodiment, the 9 independent values are approximated using selected combinations of three charge values $Q_d$, $Q_s$, $Q_g$. For example the capacitance $C_{gd}$ can be computed by approximating the partial derivative as partial difference. Thus $C_{gd}=(Q_{g1}-Q_{g0})/(V_{d1}-V_{d0})$, where $Q_{g1}$ corresponds to the charge on the gate with the given voltages $V_g$, $V_s$, $V_b$, and $V_{d1}$; and $Q_{g0}$ corresponds to the charge on the gate with the other voltages held constant and the drain voltage at $V_{d0}$. The necessary charge values are selectively retrieved from a space saving pre-determined charge table storing charge values $Q_d$, $Q_s$, $Q_g$ in terms of voltages $v_d$, $v_s$, and $v_g$ (see FIG. 5). Note that the charge table may store any 3 of the 4 charge values $Q_d$, $Q_s$, $Q_g$, $Q_b$. The missing charge value can be derived from the stored three using the equation $Q_b=Q_g-Q_d-Q_s$. In alternate embodiments, other combinations of charge values are stored instead. In yet other embodiments, a table storing the 9 independent capacitance values under various voltage conditions is employed instead, thereby further saving the computation time required to approximate the seed capacitance values (at the expense of working set space). In yet other embodiments, a table storing all 16 capacitance values under various voltage conditions is employed instead, thereby further saving the computation time required to derive the non-seed capacitance values (also at the expense of working set space).

Referring back to FIG. 3, as illustrated we will now describe each device characterization, what capacitance values are calculated, and how the voltage equations are represented for solution.

The types I and II device characterizations are used when the best accuracy is desired. Type II is for special configurations where the transistor drain and source are shorted and thus the transistor behaves like a capacitor. Type I, then, is for other non-drain-source shorted configurations. Formulating the voltage equations to be solved when a type I device is present uses all 16 of the capacitances described above. Equations are of the form:

$$I_d = C_{dd}{}^*v_d{}' - C_{dg}{}^*v_g{}' - C_{ds}{}^*v_s{}' - C_{ds}{}^*v_b{}'$$

$$I_g = C_{gg}{}^*v_g{}' - C_{gd}{}^*v_d{}' - C_{gs}{}^*v_s{}' C_{gb}{}^*v_b{}';$$

$$I_s = C_{ss}{}^*v_s{}' - C_{sg}{}^*v_g{}' - C_{sd}{}^*v_d{}' - C_{sb}{}^*v_b{}';$$

$$I_b + I_d + I_g + I_s = 0,$$

where $I_b$, $I_d$, $I_s$, and $I_g$ are transistor capacitive coupling current values at a transistor's bulk, drain, source and gate respectively, $C_{xy}$ are capacitance values between x and y, which stands for bulk, drain, source or gate, and $v_b{}'$, $v_d{}'$, $v_s{}'$ and $v_g{}'$ are derivatives of bulk, drain, source and gate voltages respectively.

The type II device is similar but uses only 14 of the capacitances since the shorted capacitors Cds and Csd are not needed.

The type IIII device characterization is applied to the devices that have not been marked as types I or II. This generally includes transistors that have not been identified as requiring highest accuracy, or whose bulk is connected to a fixed voltage supply or ground, or whose source and drain are not shorted. With the type IIII transistors the loose coupling of the gate to the drain-source is exploited to improve performance. Instead of simultaneously solving the gate, drain and source voltages, when solving one side (the gate) or the other (drain-source) the opposite side's voltage (s) is (are) estimated so the equations can be decoupled. The type IIII device characterization is thus further dynamically assigned as a forward evaluation (type IIIA) or a reverse evaluation (type IIIB). For Type IIIA the estimated first derivative of the gate voltage is used to compute Miller currents injected into the drain and source as follows:

$$I_{dmiller} = C_{dg}{}^*\text{Est}(v'_g)$$

$$I_{smiller} = C_{sg}{}^*\text{Est}(v'_g)$$

For Type IIIB the estimated first derivatives of the drain and source voltages are used to compute Miller currents injected into the gate as follows:

$$I_{gmiller} = C_{gd}{}^*\text{Est}(v'_d) + C_{gs}{}^*\text{Est}(v'_s)$$

$I_{dmiller}$, $I_{smiller}$, and $I_{gmiller}$ are Miller current values at a transistor's drain, source and gate respectively, $C_{xy}$ are capacitance values between x and y, which stands for drain, source or gate, Est($v_x'$) is an estimate of a derivative of drain, source or gate voltage (depending on whether x is d, s or g).

Figure 6:
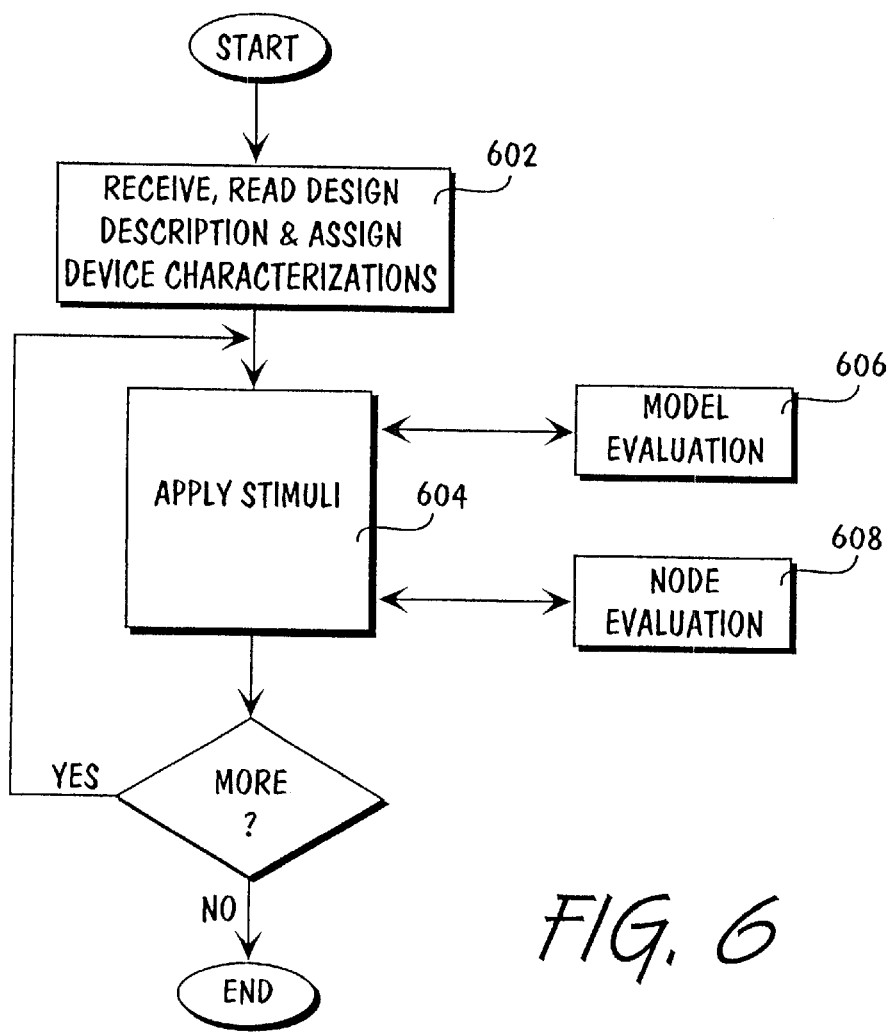
FIG. 6 illustrates a method of the present invention in accordance with one embodiment.
Figure 7:
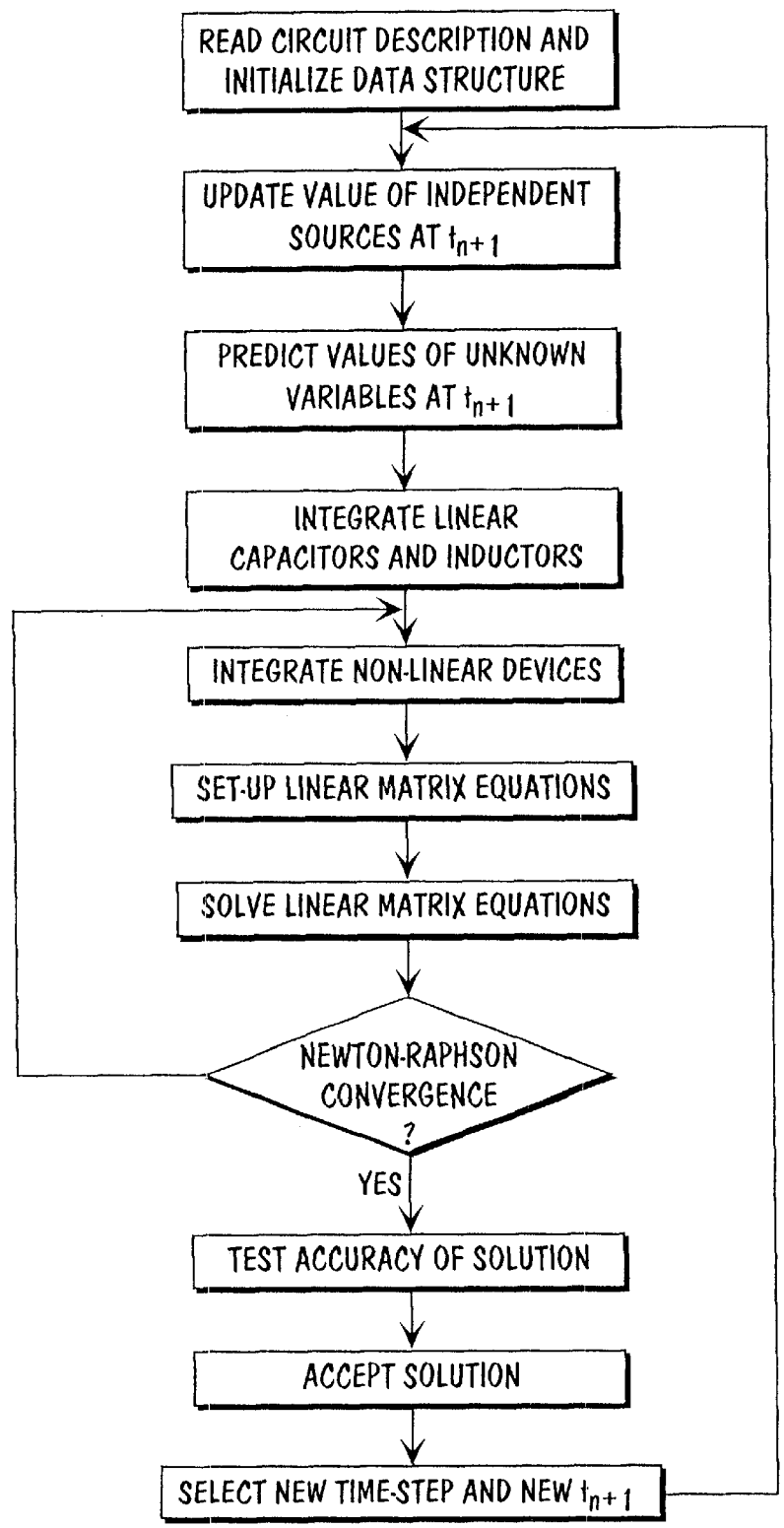
FIG. 7 illustrates a prior art approach to circuit simulation.

Referring now to FIG. 6, wherein a block diagram illustrating a method of the present invention is shown. As illustrated, at 602 a design description of an IC design is received and read by the design reader. During this operation, for selected ones of the electronic devices of the IC design, the design reader assigns device characterizations to the electronic devices. At 604, stimuli are applied to the modeling processes modeling the electronic devices in accordance with connectivity information provided by the design description. At 606 and 608, in between application of the stimuli, i.e. during simulation, the model evaluators and node evaluators are selectively invoked to evaluate various parameter values of the models and states of the connections connecting the models respectively. At 606, the model evaluations are adaptively performed in accordance with the device characterizations assigned, as described earlier referencing FIGS. 2–5, resulting in overall improvement to accuracy and performance. Operation 604, and selectively operations 606 and 608, are repeated as many times as necessary until the simulation has been run for the desired duration, e.g. for sufficient number of clock cycles.

Figure 8:
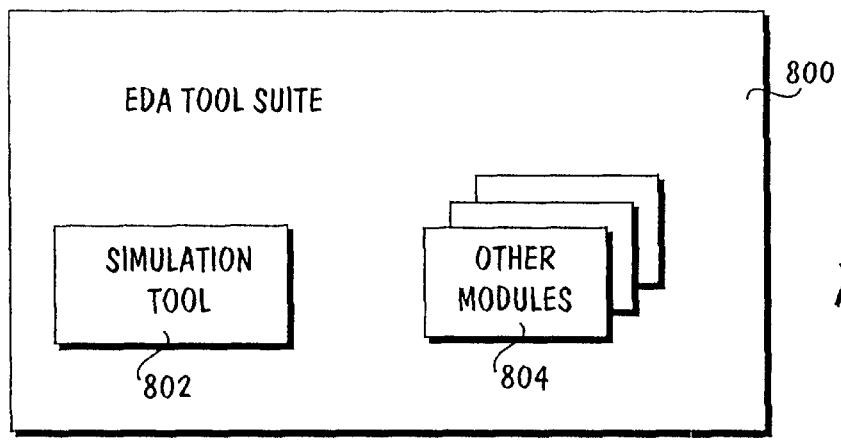
FIG. 8 illustrates an example EDA tool incorporated with the IC design simulation tool of the present invention, in accordance with one embodiment.

Referring now to FIG. 8, wherein an EDA tool incorporated with the simulation tool of the present invention in accordance with one embodiment is shown. As illustrated, EDA tool suite 800 includes simulation tool 802 incorporated with the teachings of the present invention as described earlier with references to FIGS. 1–6 or 2–7. Additionally, EDA tool suite 800 includes other tool modules 804. Examples of these other tool modules 802 include but not limited to synthesis module, layout verification module and so forth.

Figure 9:
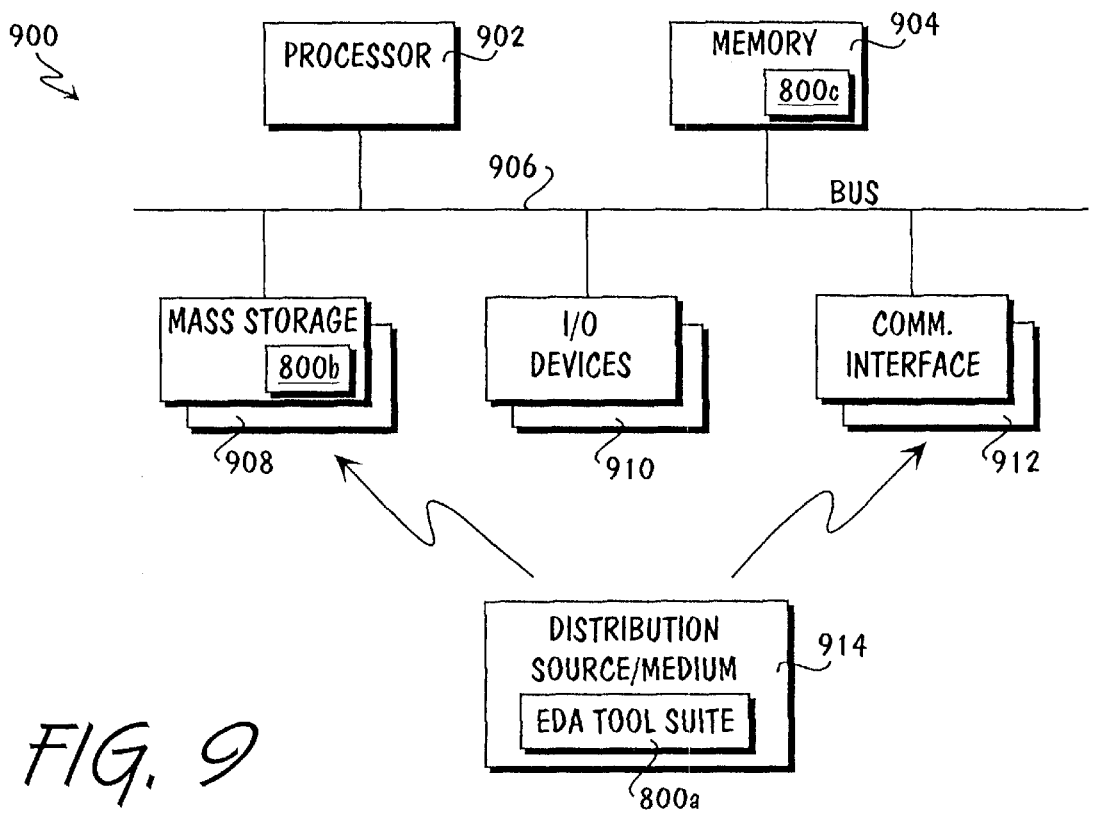
FIG. 9 illustrates an example computer system suitable to be programmed with the programming instructions implementing the EDA tool of FIG. 8.

FIG. 9 illustrates one embodiment of a computer system suitable for use to practice the present invention. As shown, computer system 900 includes processor 902 and memory 904 coupled to each other via system bus 906. Coupled to system bus 906 are non-volatile mass storage 908, such as hard disks, floppy disk, and so forth, input/output devices 910, such as keyboard, displays, and so forth, and communication interfaces 912, such as modem, LAN interfaces, and so forth. Each of these elements perform its conventional functions known in the art. In particular, system memory 904 and non-volatile mass storage 908 are employed to store a working copy and a permanent copy of the programming instructions implementing the above described teachings of the present invention. System memory 904 and non-volatile mass storage 906 may also be employed to store the IC designs. The permanent copy of the programming instructions to practice the present invention may be loaded into non-volatile mass storage 908 in the factory, or in the field, using distribution source/medium 914 and optionally, communication interfaces 912. Examples of distribution medium 914 include recordable medium such as tapes, CDROM, DVD, and so forth. In one embodiment, the programming instructions are part of a collection of programming instructions implementing EDA tool 800 of FIG. 8. The constitution of elements 902–914 are well known, and accordingly will not be further described.

In general, those skilled in the art will recognize that the present invention is not limited to the embodiments described. Instead, the present invention can be practiced with modifications and alterations within the spirit and scope of the appended claims. The description is thus to be regarded as illustrative, instead of restrictive on the present invention.

Thus, a method and an apparatus for adaptively performing model evaluations during IC design simulation have been described.

What is claimed is:

1. A computer implemented method comprising:
   assigning device characterizations to a plurality of electronic devices of an integrated circuit (IC) design; and
   simulating the IC design, and while simulating the IC design, adaptively performing model evaluations of said electronic devices at different performance or accuracy levels in accordance with said assigned device characterization, wherein said adaptive performance of model evaluations comprise performing model evaluations, selectively employing different computation techniques that yield performance/accuracy levels commensurate with performance/accuracy requirements of the assigned device characterizations.

2. The method of claim 1, wherein said adaptive performance of model evaluations further comprise adaptively retrieving different quantities of data in accordance with data requirements of said different computation techniques employed.

3. A machine readable medium having stored thereon machine executable instructions to implement a method comprising:
   assigning device characterizations to a plurality of electronic devices of an integrated circuit (IC) design; and
   simulating the IC design, and while simulating the IC design, adaptively performing model evaluations of said electronic devices at different performance or accuracy levels in accordance with said assigned device characterization, wherein said adaptive performance of model evaluations comprise performing model evaluations, selectively employing different computation techniques that yield performance/accuracy levels commensurate with performance/accuracy requirements of the assigned device characterizations.

4. The machine readable medium of claim 3, wherein the adaptive performance of model evaluations further comprises adaptively retrieving different quantities of data in accordance with data requirements of said different computation techniques employed.

5. A computer implemented method comprising:
   assigning device characterizations to a plurality of electronic devices of an integrated circuit (IC) design; and
   simulating the IC design, and while simulating the IC design, adaptively performing model evaluations of said electronic devices at different performance or accuracy levels in accordance with said assigned device characterizations, wherein said electronic devices include transistors, and said adaptive performance of model evaluations comprise performing transistor model evaluations, employing different current computation techniques that yield different performance/accuracy levels that are commensurate with performance/accuracy requirements of the transistors' assigned device characterizations.

6. The method of claim 5, wherein said different current computation techniques include a first computation technique that computes capacitance values for a fully coupled voltage solution, and a second computation technique that computes a combination of capacitance and current values for a partially decoupled voltage solution.

7. The method of claim 6, wherein said capacitance values include a subset of independent capacitance values, and the independent capacitance values ($C_{xy}$) are computed from a plurality of voltage dependent charge values ($Q_x$) as follows:

$$C_{xy} = dQ_x/dV_y$$

where $dQ_x/dV_y$ is the partial derivative of $Q_x$ with respect to $V_y$
and x and y are drain, gate or source.

8. The method of claim 7, wherein said subset of independent capacitance values ($C_{xy}$) are $C_{dd}$, $C_{dg}$, $C_{ds}$, $C_{gg}$, $C_{gd}$, $C_{gs}$, $C_{ss}$, $C_{sd}$, $C_{sg}$, and said capacitance values further include a subset of dependent capacitance values ($C_{xy}$), $C_{db}$, $C_{gb}$, $C_{sb}$, $C_{bd}$, $C_{bg}$, $C_{bs}$, $C_{bb}$.

9. The method of claim 8, wherein said dependent capacitance values ($C_{xy}$) are derived from the independent capacitance values ($C_{xy}$) as follows:

$$C_{db} = C_{dd} - C_{dg} - C_{ds}$$

$$C_{gb} = C_{gg} - C_{gd} - C_{gs}$$

$$C_{sb} = C_{ss} - C_{sg} - C_{sd}$$

$$C_{bd} = C_{dd} - C_{gd} - C_{sd}$$

$$C_{bg} = C_{gg} - C_{dg} - C_{sg}$$

$$C_{bs} = C_{ss} - C_{gs} - C_{ds}$$

$$C_{bb} = C_{db} + C_{gb} + C_{sb} = C_{bd} + C_{bg} + C_{bs}.$$

10. The method of claim 9, wherein said fully coupled voltage solution comprises solving transistor capacitive coupling current equations expressed in terms of transistor capacitance and derivatives of drain, gate, source or bulk voltages as follows:

$$I_d = C_{dd}*v_d' - C_{dg}*v_g' - C_{ds}*v_s' - C_{db}*v_b';$$

$$I_g = C_{gg}*v_g' - C_{gd}*v_d' - C_{gs}*v_s' - C_{gb}*v_b';$$

$$I_s = C_{ss}*v_s' - C_{sg}*v_g' - C_{sd}*v_d' - C_{sb}*v_b';$$

$$I_b + I_d + I_g + I_s = 0.$$

where $I_b$, $I_d$, $I_s$, and $I_g$ are transistor capacitive coupling current values at a transistor's bulk, drain, source and gate respectively, $C_{xy}$ are capacitance values between x and y, which stands for bulk, drain, source or gate, and $v_b'$, $v_d'$, $v_s'$ and $v_g'$ are derivatives of bulk, drain, source and gate voltages respectively.

11. The method of claim 6, wherein said partially decoupled voltage solution comprises computing current values from capacitance values and estimated derivatives of voltages as follows:

$$I_{dmiller} = C_{dg}*Est(v'_g)$$

$$I_{smiller} = C_{sg}*Est(v'_g)$$

$$I_{gmiller} = C_{gd}*Est(v'_d) + C_{gs}*Est(v'_s)$$

where $I_d$, $I_s$, and $I_g$ are current values at a transistor's drain, source and gate respectively, $C_{xy}$ are capacitance values between x and y, which stands for drain, source or gate, $Est(v_x')$ is an estimate of a derivative of drain, source or gate voltage (depending on whether x is d, s or g).

12. The method of claim 7, wherein said performance of transistor model evaluations further comprise retrieving said voltage dependent charge values from a charge value table.

13. The method of claim 12, wherein said charge value table comprises a plurality of charge tuples ($Q_i$, $Q_j$, $Q_k$) for a plurality of voltage tuples ($v_{db}$, $v_{gb}$, $v_{sb}$), where the subscripts g, d, s, b stand for gate, drain, source and bulk respectively.

14. The method of claim 13, wherein said retrieval is performed using a model name and geometry of a transistor.

15. The method of claim 14, wherein said geometry of a transistor comprises a length and a width of the transistor.

16. The method of claim 13, wherein said retrieval further comprises generating said voltage dependent charge values through interpolation if voltage dependent charge values for a transistor having a particular geometry is not available in said charge table.

17. A machine readable medium having stored thereon machine executable instructions to implement a method comprising:

assigning device characterizations to a plurality of electronic devices of an integrated circuit (IC) design; and simulating the IC design, and while simulating the IC design, adaptively performing model evaluations of said electronic devices at different performance or accuracy levels in accordance with said assigned device characterizations, wherein said electronic devices include transistors, and said adaptive performance of model evaluations comprise performing transistor model evaluations, employing different current computation techniques that yield different performance/accuracy levels that are commensurate with performance/accuracy requirements of the transistors' assigned device characterizations.

18. The machine readable medium of claim 17, wherein said different current computation techniques include a first computation technique that computes capacitance values for a fully coupled voltage solution, and a second computation technique that computes a combination of capacitance and current values for a partially decoupled voltage solution.

19. The machine readable medium of claim 18, wherein said capacitance values include a subset of independent capacitance values, and the independent capacitance values ($C_{xy}$) are computed from a plurality of voltage dependent charge values ($Q_x$) as follows:

$$C_{xy} = dQ_x/dV_y$$

where $dQ_x/dV_y$ is the partial derivative of $Q_x$ with respect to $V_y$
and x and y are drain, gate or source.

20. The machine readable medium of claim 19, wherein said subset of independent capacitance values ($C_{xy}$) are $C_{dd}$, $C_{dg}$, $C_{ds}$, $C_{gg}$, $C_{gd}$, $C_{gs}$, $C_{ss}$, $C_{sd}$, $C_{sg}$, and said capacitance values further include a subset of dependent capacitance values ($C_{xy}$), $C_{db}$, $C_{gb}$, $C_{sb}$, $C_{bd}$, $C_{bg}$, $C_{bs}$, $C_{bb}$.

21. The machine readable medium of claim 20, wherein said dependent capacitance values ($C_{xy}$) are derived from the independent capacitance values ($C_{xy}$) as follows:

$$C_{db} = C_{dd} - C_{dg} - C_{ds}$$

$$C_{gb} = C_{gg} - C_{gd} - C_{gs}$$

$$C_{sb} = C_{ss} - C_{sg} - C_{sd}$$

$$C_{bd} = C_{dd} - C_{gd} - C_{sd}$$

$$C_{bg} = C_{gg} - C_{dg} - C_{sg}$$

$$C_{bs} = C_{ss} - C_{gs} - C_{ds}$$

$$C_{bb} = C_{db} + C_{gb} + C_{sb} = C_{bd} + C_{bg} + C_{bs}.$$

22. The machine readable medium of claim 21, wherein said fully coupled voltage solution comprises solving transistor capacitive coupling current equations expressed in terms of transistor capacitance and derivatives of drain, gate, source or bulk voltages as follows:

$$I_d = C_{dd}*v_d' - C_{dg}*v_g' - C_{ds}*v_s' - C_{db}*v_b';$$

$$I_g = C_{gg}*v_g' - C_{gd}*v_d' - C_{gs}*v_s' - C_{gb}*v_b';$$

$$I_s = C_{ss}*v_s' - C_{sg}*v_g' - C_{sd}*v_d' - C_{sb}*v_b';$$

$$I_b + I_d + I_g + I_s = 0.$$

where $I_b$, $I_d$, $I_s$, and $I_g$ are transistor capacitive coupling current values at a transistor's bulk, drain, source and gate respectively, $C_{xy}$ are capacitance values between x and y, which stands for bulk, drain, source or gate, and $v_b'$, $v_d'$, $v_s'$ and $v_g'$ are derivatives of bulk, drain, source and gate voltages respectively.

23. The machine readable medium of claim 18, wherein said partially decoupled voltage solution comprises computing current values from capacitance values and estimated derivatives of voltages as follows:

$$I_{dmiller} = C_{dg}*Est(v'_g)$$

$$I_{smiller} = C_{sg}*Est(v'_g)$$

$$I_{gmiller} = C_{gd}*Est(v'_d) + C_{gs}*Est(v'_s)$$

where $I_d$, $I_s$, and $I_g$ are current values at a transistor's drain, source and gate respectively, $C_{xy}$ are capacitance values between x and y, which stands for drain, source or gate, $Est(v_x')$ is an estimate of a derivative of drain, source or gate voltage (depending on whether x is d, s or g).

24. The machine readable medium of claim 19, wherein said performance of transistor model evaluations further comprise retrieving said voltage dependent charge values from a charge value table.

25. The machine readable medium of claim 24, wherein said charge value table comprises a plurality of charge tuples $(Q_i, Q_j, Q_k)$ for a plurality of voltage tuples $(v_{db}, v_{gb}, v_{sb})$, where the subscripts g, d, s, b stand for gate, drain, source and bulk respectively.

26. The machine readable medium of claim 25, wherein said retrieval is performed using a model name and geometry of a transistor.

27. The machine readable medium of claim 26, wherein said geometry of a transistor comprises a length and a width of the transistor.

28. The machine readable medium of claim 25, wherein said retrieval further comprises generating said voltage dependent charge values through interpolation if voltage dependent charge values for a transistor having a particular geometry is not available in said charge table.

29. A computer system comprising:
a storage medium having stored therein a plurality of programming instructions; and
a processor coupled to the storage medium to execute the plurality of programming instructions to assign device characterizations to a plurality of electronic devices of an integrated circuit (IC) design, and to simulate the IC design, wherein while simulating the IC design, adaptively perform model evaluations of said electronic devices at different performance or accuracy levels in accordance with said assigned device characterizations, wherein the processor executes the programming instructions to selectively employ different computation techniques that yield performance/accuracy levels commensurate with performance/accuracy requirements of the assigned device characterizations.

30. The computer system of claim 29, wherein the storage medium further comprises data employed for said adaptive evaluation, and the processor executes the programming instructions to adaptively retrieve different quantities of the data in accordance with data requirements of the different computation techniques employed.

31. A computer system comprising:
a storage medium having stored therein a plurality of programming instructions; and
a processor coupled to the storage medium to execute the plurality of programming instructions to assign device characterizations to a plurality of electronic devices of an integrated circuit (IC) design, and to simulate the IC design, wherein while simulating the IC design, adaptively perform model evaluations of said electronic devices at different performance or accuracy levels in accordance with said assigned device characterizations, wherein the processor executes the programming instructions to perform transistor model evaluations, employing different current computation techniques that yield different performance/accuracy levels that are commensurate with performance/accuracy requirements of the transistors' assigned device characterizations.

32. The computer system of claim 31, wherein the processor executes the programming instructions to perform said transistor model evaluation employing a first computation technique that computes capacitance values for a fully coupled voltage solution, and to perform said transistor model evaluation employing a second computation technique that computes a combination of capacitance and current values for a partially decoupled voltage solution.

33. The computer system of claim 32, wherein
said capacitance values include a subset of independent capacitance values, $C_{dd}$, $C_{dg}$, $C_{ds}$, $C_{gg}$, $C_{gd}$, $C_{gs}$, $C_{ss}$, $C_{sd}$, $C_{sg}$, and a subset of dependent transistor values, $C_{db}$, $C_{gb}$, $C_{sb}$, $C_{bd}$, $C_{bg}$, $C_{bs}$, $C_{bb}$;
the processor executes the programming instructions to compute the independent capacitance values ($C_{xy}$) from a plurality of voltage dependent charge values ($Q_x$) as follows:

$$C_{xy} = dQ_x/dV_y$$

where $dQ_x/dV_y$ is the partial derivative of $Q_x$ with respect to $V_y$ and x and y are drain, gate or source; and
the processor executes the programming instructions to derive the dependent capacitance values as follows:

$$C_{db} = C_{dd} - C_{dg} - C_{ds}$$

$$C_{gb} = C_{gg} - C_{gd} - C_{gs}$$

$$C_{sb} = C_{ss} - C_{sg} - C_{sd}$$

$$C_{bd} = C_{dd} - C_{gd} - C_{sd}$$

$$C_{bg} = C_{gg} - C_{dg} - C_{sg}$$

$$C_{bs} = C_{ss} - C_{gs} - C_{ds}$$

$$C_{bb} = C_{db} + C_{gb} + C_{sb} = C_{bd} + C_{bg} + C_{bs}.$$

34. The computer system of claim 32, wherein the processor executes the programming instructions to solve transistor capacitive coupling current equations expressed in terms of transistor capacitance and derivatives of drain, gate, source or bulk voltages, to compute said fully coupled voltage solution, as follows:

$$I_d = C_{dd}*v_d' - C_{dg}*v_g' - C_{ds}*v_s' - C_{db}*v_b';$$

$$I_g = C_{gg}*v_g' - C_{gd}*v_d' - C_{gs}*v_s' - C_{gb}*v_b';$$

$$I_s = C_{ss}*v_s' - C_{sg}*v_g' - C_{sd}*v_d' - C_{sb}*v_b';$$

$$I_b + I_d + I_g + I_s = 0.$$

where $I_b$, $I_d$, $I_s$, and $I_g$ are transistor capacitive coupling current values at a transistor's bulk, drain, source and gate respectively, $C_{xy}$ are capacitance values between x and y, which stands for bulk, drain, source or gate, and $v_b'$, $v_d'$, $v_s'$ and $v_g'$ are derivatives of bulk, drain, source and gate voltages respectively.

35. The computer system of claim 32, wherein the processor executes the programming instructions to compute current values from capacitance values and estimated derivatives of voltages, to perform said partially decoupled voltage solution, as follows:

$$I_d = C_{dg}*\text{Est}(v'_g)$$

$$I_s = C_{sg}*\text{Est}(v'_g)$$

$$I_g = C_{gd}*\text{Est}(v'_d) + C_{gs}*\text{Est}(v'_s)$$

where $I_d$, $I_s$, and $I_g$ are current values at a transistor's drain, source and gate respectively, $C_{xy}$ are capacitance values between x and y, which stands for drain, source or gate, $\text{Est}(v_x')$ is an estimate of a derivative of drain, source or gate voltage (depending on whether x is d, s or g).

36. The computer system of claim 32, wherein said storage medium further comprises a charge value table having a plurality of charge tuples ($Q_i$, $Q_j$, $Q_k$) for a plurality of voltage tuples ($v_{db}$, $v_{gb}$, $v_{sb}$), where the subscripts g, d, s, b stand for gate, drain, source and bulk respectively; and said processor executes the programming instructions to retrieve said voltage dependent charge values from the charge value table to perform said transistor model evaluations.

* * * * *